(12) United States Patent
Cevher et al.

(10) Patent No.: US 10,082,551 B2
(45) Date of Patent: Sep. 25, 2018

(54) LEARNING-BASED SUBSAMPLING

(71) Applicant: ECOLE POLYTECHNIQUE FEDERALE DE LAUSANNE (EPFL), Lausanne (CH)

(72) Inventors: Volkan Cevher, Chavannes-Renens (CH); Yen-Huan Li, Écublens (CH); Ilija Bogunovic, Lausanne (CH); Luca Baldassarre, Lausanne (CH); Jonathan Scarlett, Lausanne (CH); Baran Gözcü, Grandvaux (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 255 days.

(21) Appl. No.: 14/887,295

(22) Filed: Oct. 19, 2015

(65) Prior Publication Data
US 2017/0109650 A1   Apr. 20, 2017

(51) Int. Cl.
G01R 33/54   (2006.01)
G01R 33/48   (2006.01)
G06F 17/11   (2006.01)
G06N 99/00   (2010.01)

(52) U.S. Cl.
CPC ............. G01R 33/54 (2013.01); G01R 33/48 (2013.01); G06F 17/11 (2013.01); G06N 99/005 (2013.01)

(58) Field of Classification Search
CPC ...... G06N 99/005; G06N 5/022; G01R 33/54; G01R 33/48
See application file for complete search history.

(56) References Cited

U.S. PATENT DOCUMENTS

| | | | |
|---|---|---|---|
| 2008/0197842 A1* | 8/2008 | Lustig | G01R 33/561 324/307 |
| 2010/0067761 A1* | 3/2010 | Jakobsson | G06K 9/6209 382/131 |
| 2015/0097563 A1* | 4/2015 | Zenge | G01R 33/3852 324/309 |

OTHER PUBLICATIONS

Candes, Emmanuel J. et al., An Introduction to Compressive Sampling, IEEE Signal Processing Magazine, Mar. 2008, pp. 21-30.
Lustig, M. et al., Sparse MRI: The Application of Compressed Sensing for Rapid MR Imaging, Magnetic Resonance Systems Research Laboratory, Department of Electrical Engineering, Stanford (2007) pp. 1-41.
Roman, B. et al., On asymptotic structure in compressed sensing, Department of Applied Mathematics and Theoretical Physics, University of Cambridge, Jul. 5, 2014, pp. 1-10.
Wang, Z., et al., Variable Density Compressed Image Sampling, IEEE Transactions on Image Processing, vol. 19, No. 1, Jan. 2010, pp. 264-270.
Puy, G. et al., On Variable Density Compressive Sampling, Sep. 28, 2011, pp. 1-4.

(Continued)

*Primary Examiner* — Ajay Ojha
(74) *Attorney, Agent, or Firm* — Maschoff Brennan

(57) ABSTRACT

The present invention concerns a method of sampling a test signal. The method comprises: acquiring training signals sampled at a plurality of sampling locations; running an optimization procedure for determining an index set of n indices, representing a subset of the sampling locations, that maximize a function, over the training signals, of a quality parameter representing how well a given training signal is represented by the n indices; and sampling the test signal at the sampling locations represented by the n indices.

13 Claims, 3 Drawing Sheets

(56) References Cited

OTHER PUBLICATIONS

Elad, M., Optimized Projections for Compressed Sensing, The Department of Computer Science; The Technion { Israel Institute of Technology. Oct. 19, 2006, pp. 1-22.

Hegde, C. et al., NuMax: A Convex Approach for Learning Near-Isometric Linear Embeddings, Journal of Machine Learning Research (2013), pp. 1-35.

Bhan, N. et al., Tractability of Interpretability via Selection of Group-Sparse Models, Jul. 7, 2013, IEEE International Symposium on Information Theory, pp. 1037-1041.

Filmus, Y. et al., A Tight Combinatorial Algorithm for Submodular Maximization Subject to a Matroid Constraint, Oct. 20, 2012, IEEE 53rd Annual Symposium on Foundations of Computer Science, pp. 659-668.

Krause, A. et al., Robust Submodular Observation Selection, Journal of Machine Learning Research 9 (2008) pp. 2761-2801.

Adcock, B. and Anders C. Hansen, Generalized sampling and infinite-dimensional compressed sensing, Technical report NA2011/02, DAMTP, University of Cambridge, 2011.

Vellagoundar and Machireddy. "A Robust Adaptive Sampling Method for Faster Acquisition of MR Images", Magnetic Resonance Imaging 33, Jan. 8, 2015.

Knoll et al., "Adapted Random Sampling Patterns for Accelerated MRI", Europe PMC Funders Group Author Manuscript, MAMGA, May 6, 2014.

Zhang et al., "Energy Preserved Sampling for Compressed Sensing MRI", Computational and Mathematical Methods in Medicine, vol. 2014, pp. 12, May 26, 2014.

Liu et al., "Under-sampling Trajectory Design for Compressed Sensing MRI", 34th Annual International Conference of the IEEE, Aug. 28-Sep. 1, 2012.

\* cited by examiner

LEARNING-BASED SUBSAMPLING

TECHNICAL FIELD

The invention relates to the field of signal sampling, and more particularly to a learning-based signal sampling process. The invention also relates to a signal sampling apparatus for carrying out the signal sampling process.

BACKGROUND OF THE INVENTION

Modern information acquisition systems have recently made significant advances thanks to new methods for exploiting structure in signals, allowing one to operate at the "information level" of the data in order to reduce resource requirements such as data processing time and power. In particular, the compressive sensing (CS) problem presents a new sampling paradigm permitting rates far below the Shannon-Nyquist rate for signals that are sparse in some basis.

In the past decade, there has been a significant amount of research on the problem of recovering a structured signal (e.g. a signal with few non-zero coefficients) based on dimensionality-reduced measurements. For example, for finite-dimensional signals, one may seek to recover a signal $x \in \mathbb{C}^p$ given observations of the form $$b = Ax + w, \quad (1)$$

where $A \in \mathbb{C}^{n \times p}$ is a known measurement matrix (e.g. as explained below), and $w \in \mathbb{C}^n$ represents unknown additive noise. $\mathbb{C}$ denotes a set of complex numbers.

This problem is often referred to as compressive sensing, and is ubiquitous in signal processing, having an extensive range of applications including medical resonance imaging (MRI), spectroscopy, radar, Fourier optics and computerized tomography. The key challenges in CS revolve around the identification of structure in the signal (e.g. sparsity), computationally efficient algorithms, and measurement matrix designs. The present invention focuses primarily on the last of these.

In the classical CS setting where x is sparse, the best theoretical recovery guarantees are obtained by random matrices with independent and identically distributed entries, along with sparsity-promoting convex optimization methods. However, such random matrices impose a significant burden in the data processing pipeline in terms of both storage and computation as the problem dimension p increases, where p indicates the signal dimension and can, for example, be the number of pixels of a fully sampled image.

To overcome these limitations, one can consider structured measurement techniques. In the above finite-dimensional setting, significant attention has been paid to subsampled structured matrices of the form $$A = P_\Omega \Psi, \quad (2)$$

where $\Psi \in \mathbb{C}^{p \times p}$ is an orthonormal basis, and $P_\Omega: \mathbb{C}^p \to \mathbb{C}^n$, where $[P_\Omega x]_l = x_{\Omega_l}$, $l = 1, \ldots, n$, is a subsampling operator that selects the rows indexed by the set $\Omega$, with $|\Omega| = n$. Thus, n represents the total number of measurements and is typically much smaller than p. Popular choices for $\Psi$ include Fourier and Hadamard matrices, both of which permit efficient storage and computation. In other applications, $\Psi$ may not necessarily be orthonormal and may even be dimensionality increasing.

Measurements of the form (2) are also of direct interest in applications, such as MRI and Fourier optics, where one cannot choose the basis in which measurements are taken, but one does have the freedom to choose a subsampling pattern. More generally, one can consider the problem of subsampling from an infinite set of possible locations.

Constraining the measurements to be in a subsampled form raises the following fundamental question: How do we best choose the index set $\Omega$, also known as a sample set? The answer depends on the structure known to be inherent in x, as well as the recovery algorithm used. FIG. 1 illustrates the definition of the index set $\Omega$ consisting of indices 3. For instance, a typical MRI resolution is 256×256 pixels 5. These pixels may be arranged in a matrix as shown in FIG. 1. To represent a full data sample set 7, a subset of the data can be sampled and used for further processing. The data outside of the subset may be considered to be of low relevance. The number and location of the samples chosen to represent the data or signal are defined by the index set $\Omega$ so that one index may correspond to one sample. The index set can be understood to simply refer to the ordering of the data samples. Once sampling has been done in the locations indicated by the index set, this results in the sampled data in the locations defined by the index set. The aim is to choose the index set so that the number of the indices in the index set $\Omega$ is as low as possible, yet still allowing a sufficiently precise reconstruction of the original data signal represented by the full data sample set. The above definitions also apply to analog signals, such as that shown in FIG. 2. Again, samples are taken at the locations indicated by the indices of the index set $\Omega$.

For general sparse vectors, uniform random subsampling provides a variety of recovery guarantees under suitable assumptions about the incoherence of the sparsity basis of the signal to be recovered. However, it has been observed that this approach can be significantly outperformed in real-world applications via non-uniform random subsampling techniques, in which one takes more samples in the parts of the signal that tend to contain more energy, thus exploiting structured sparsity in the signal as opposed to sparsity alone. Randomized approaches have been proposed previously, considering explicit distributions of the index set $\Omega$ containing parameters that require ad hoc tuning for the application at hand. The term randomized sampling is understood to mean a sampling process in which subsampling indices are drawn from a probability distribution, rather than being generated deterministically.

From a practical perspective, the randomization of the index set $\Omega$ is typically not desirable, and perhaps not even possible. Moreover, there is strong evidence that in real-world applications there is a "best" choice of the index set $\Omega$ that one should aim for. For instance, while the compression standard may not require it, the subsampling for JPEG in the discrete cosine transform (DCT) domain is typically chosen independently of the image being compressed, in order to simplify the encoder. The indices for MRI systems, which are based on Fourier measurements, are often selected randomly, based on matching image statistics and manual tuning, and are then fixed for subsequent scans.

Thus, as explained above, the existing solutions for determining the index set $\Omega$ are not optimal, and there is a need for a process for choosing the index set $\Omega$ more efficiently in the absence of application-specific knowledge.

SUMMARY OF THE INVENTION

According to a first aspect of the invention, there is provided a method of sampling a signal as recited in claim 1.

The proposed new solution has the advantage that the proposed approach has a very high performance, i.e. it yields state-of-the-art performance in several applications, while having the notable advantages of avoiding any reliance on randomization, and permitting the use of a highly efficient and scalable linear encoders and decoders, e.g. encoders and decoders using only standard matrix multiplications when the sampling basis is orthonormal. Thus, the teachings of the present invention challenge the conventional wisdom in CS that non-linear decoding methods, such as basis pursuit, are necessary for reliable signal recovery.

According to a second aspect of the invention, there is provided a signal sampling apparatus configured to carry out the signal sampling method according to the first aspect.

Other aspects of the invention are recited in the dependent claims attached hereto.

BRIEF DESCRIPTION OF THE DRAWINGS

Other features and advantages of the invention will become apparent from the following description of a non-limiting exemplary embodiment, with reference to the appended drawings, in which.

DETAILED DESCRIPTION OF AN EMBODIMENT OF THE INVENTION

Figure 1:
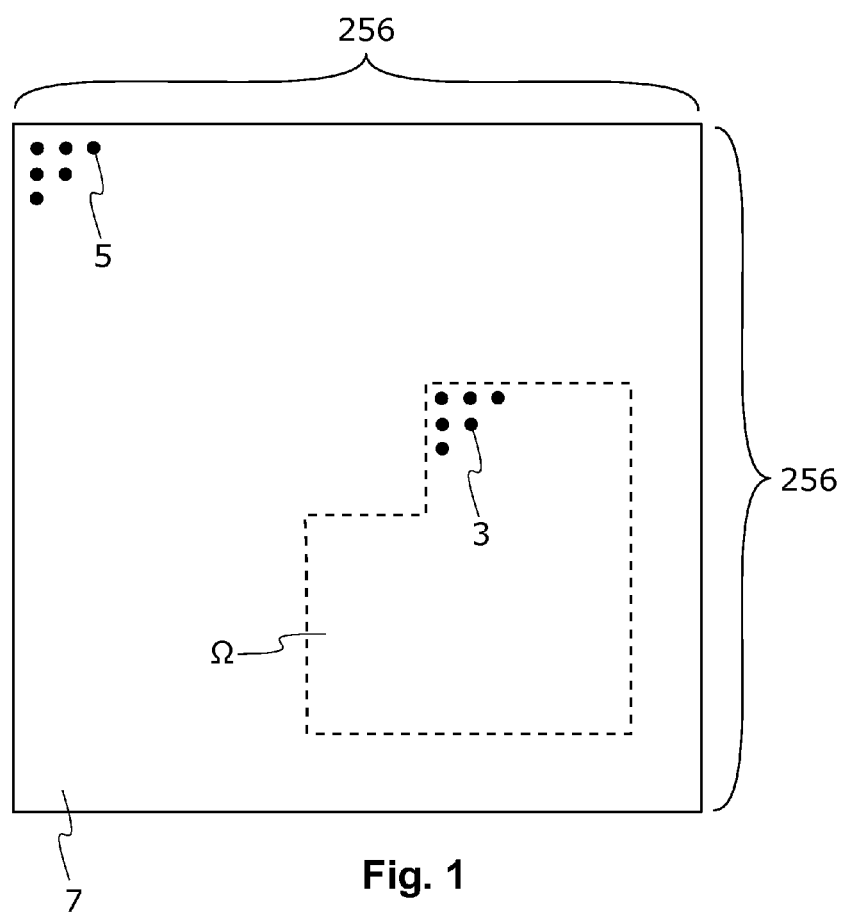
FIG. 1 illustrates an exemplary MRI data set and the definition of the index set.
Figure 2:
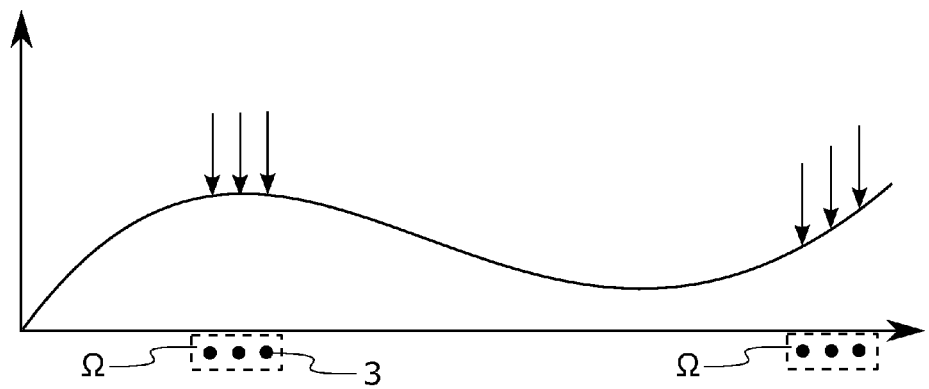
FIG. 2 illustrates an exemplary analog signal and the definition of the index set.

An embodiment of the present invention will now be described in detail with reference to the attached figures. Identical or corresponding functional and structural elements which appear in different drawings are assigned the same reference numerals.

The goal of the present invention is to design so-called principled learning-based algorithms for performing subsampling in compressive measurement systems. In the present invention, the term subsampling is understood to refer to a sampling process in which less than the whole test signal is sampled. Instead, only a portion of the signal is sampled at locations given by the indices of the index set $\Omega$. Currently, despite their importance, learning-based sampling techniques are largely unexplored. The present invention provides a data-driven approach in which a fixed index set $\Omega$ is chosen based on a set of training signals that are either fully known or already accurately known. In the present invention the word "signal" is to be understood broadly, and can be understood to be an analog signal or a discrete signal, such as a set of pixels or a data set.

The goal is to select indices of the index set $\Omega$, which perform well on unknown real test signals, also referred to as measurement signals, that are similar in some sense to the training signals. For example, the training signals can be considered to be similar to the test signal when the most energy (for example in the Fourier domain) captured by samples of the training signals is substantially at the same sampling locations as the energy captured by samples of the test signal. Another notion of similarity is that in which the locations of the large coefficients have common clustering patterns. More generally, the similarity can be measured according to a quality measure, as defined below. The training signals may represent for instance the same body parts of human beings, such as knees, taken from different people. The real test signal would represent a patient's body part, e.g. the same body part as the training signals.

This invention relies on three aspects of the system being chosen in advance in a manner that may depend on the application at hand:

1. The measurements that can be obtained are assumed to be restricted to some finite or infinite set from which subsamples are to be chosen. For example, in MRI systems, this set may be the set of all points in the Fourier domain. Other orthonormal bases include the Hadamard and Wavelet bases. Non-orthogonal designs are also possible; for example, if the measurements represent photon counts then the measurements may be based on inner products with positive-valued vectors, which are non-orthogonal when there is any overlap in the corresponding supports (i.e. locations of the non-zero entries).

2. An estimator (also referred to as a decoder) is chosen that, given measurements of a subsampled signal, produces an estimate of that signal. Two specific examples are given below, and several more estimators are available in the existing literature. For example, estimators for compressive sensing include the least absolute shrinkage and selection operator, orthogonal matching pursuit, iterative hard thresholding, and iterative reweighted least squares.

3. A quality measure, also referred to as a quality parameter, is chosen that, given the original signal and its estimate, produces a number reflecting how favorable the estimate is. For example, this number may equal the negative mean-square error between the two signals, so that a smaller mean-square error is considered more favorable. More generally, the quality can be the negative of any distance between the two signals, according to the formal mathematical definition of distance. The quality measure can also be a divergence measure between the two signals. Depending on the application, further choices may be preferable; for example, in comparing to audio signals, one may be primarily interested in quality measures based on amplitude but not phase, and such a measure will typically not correspond to a mathematical distance.

To determine the index set $\Omega$, combinatorial optimization problems are formed seeking to maximize the quality measure of the estimator when applied to the training signals, either in an average-case or worst-case sense, as explained later. In some cases, such optimization problems can be solved without explicitly applying the estimator to any of the training signals.

While combinatorial optimization problems are difficult in general, the present invention permits choices of objective functions that can be optimized by identifying beneficial discrete structures or properties, such as modularity or submodularity as explained later, that permit approximate, near-optimal, or exact solutions for the optimization problems to be obtained efficiently.

Figure 3:
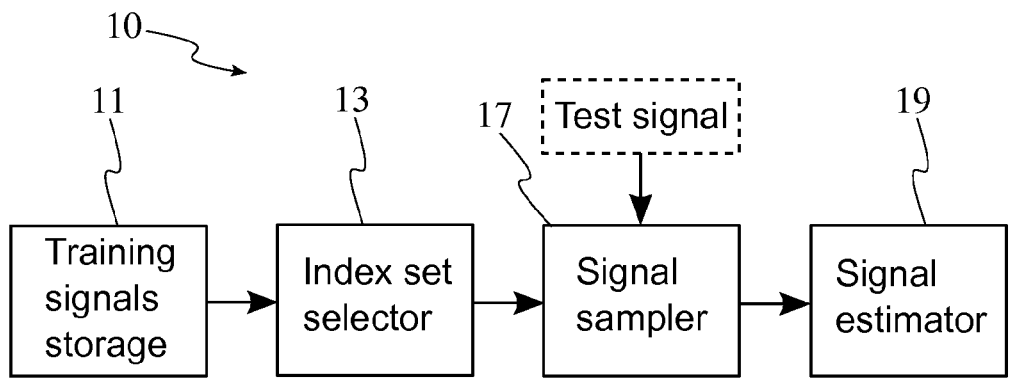
FIG. 3 is a simplified block diagram illustrating a signal sampling apparatus according to an example of the present invention.

The block diagram of FIG. 3 illustrates an electronic signal processing device 10, and more specifically a signal sampling device, in which the teachings of the present invention may be applied. A set of training signals are arranged to be stored in a storage 11. The number of the training signals is user defined. The more training signals there are, the more reliable the end result is expected to be. However, processing many large training signals can be relatively time consuming. The training signals may be fully, i.e. entirely sampled, although this does not have to be the case. In other words, the present invention is not limited to fully-sampled training signals, and instead only estimates of the training signals (e.g. obtained via existing state-of-the-art techniques) may be available. The training signals, or at least some of them, are arranged to be fed to an index set selector 13. The index set selector 13 is configured to determine the index set $\Omega$, as explained later in more detail. We seek to select an index set $\Omega$ permitting the recovery of further signals (test signals) that are in some sense similar to the training signals.

In the block diagram of FIG. 3 there is further shown a signal sampler 17, which is configured to sample a test signal. The test signal may be for example an analog signal. Alternatively, it could be a digital signal or any set of data, such as a data matrix. In this example, the signal sampler 17 takes two inputs: the test signal and the optimized index set $\Omega$ comprising optimized indices from the index set selector 13. Discrete samples obtained by the signal sampler 17 are configured to be fed to a signal estimator 19, also referred to as a decoder, configured to reconstruct from the discrete samples a signal, which one desires to be as close as possible to the original test signal. The estimated signal is thus ideally almost identical or substantially identical to the test signal.

Figure 4:
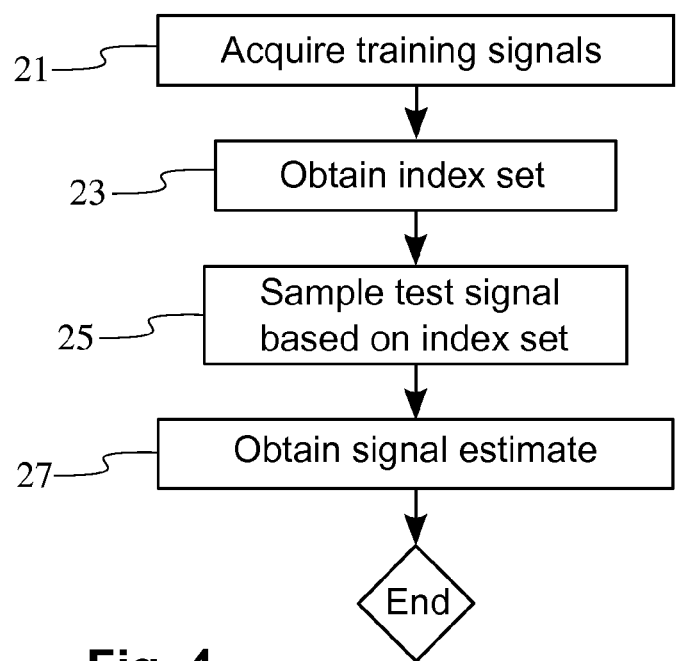
FIG. 4 is a flow chart illustrating an exemplary signal processing method according to an embodiment of the present invention.

A method of subsampling a test signal according to an embodiment of the present invention can be summarized by the flow chart of FIG. 4. In step 21 a set of training signals are acquired. In this example the training signals are fully sampled. These signals may be stored in the storage 11. The training signals have been sampled at a plurality of signal sampling locations. For example, if the training signals are signals in time domain, the sampling locations are separated by a given time interval. In step 23 an optimization procedure is run for determining an index set of n indices, representing a subset of the sampling locations, that maximize a function, over the training signals, of a quality parameter representing how well a given training signal is represented by the n indices. The number of the sampling locations in the subset is smaller than the number of the sampling locations in the plurality of the sampling locations. In step 25 the test signal is sampled only at the sampling locations represented by the n indices. In step 27 an estimate of the test signal is obtained based only on samples obtained at the sampling locations represented by the n indices. Next, the process of obtaining the index set $\Omega$ according to some examples of the present invention is explained in more detail.

We first present two optimization problems that can be considered in vast generality, even though the difficulty of solving these problems can vary depending on the choice of estimator and quality measure. Let a set of m training signals $x_1, \ldots, x_m$, be given, or if the training signals have not been fully sampled, let these be the best estimates obtained via state-of-the-art existing techniques. Suppose that the estimator 19, when applied to these training signals one-by-one for a certain index set $\Omega$, produces the m training signal estimates $\hat{x}_1(\Omega), \ldots, \hat{x}_m(\Omega)$, and suppose that the corresponding quality measures are $q(x_1, \hat{x}_1(\Omega)), \ldots, a(x_m, \hat{x}_m(\Omega))$.

The index selection scheme that maximizes the average quality is defined as $$\hat{\Omega} = \underset{\Omega \in \mathcal{A}}{\operatorname{argmax}} \sum_{j=1}^{m} q(x_j, \hat{x}_j(\Omega)), \tag{3}$$

where $\mathcal{A} \subseteq \{\Omega: |\Omega|=n\}$ is a cardinality-constrained subset of $\{1, \ldots, p\}$ in which the selected index set is assumed to lie, n being typically much smaller than p. This set can be simply the set $\{\Omega: |\Omega|=n\}$ itself, or it can be further constrained to suit the application, as outlined below. The average can also be replaced by a weighted average, as outlined below.

The index selection scheme that maximizes the minimal quality is defined as $$\hat{\Omega} = \underset{\Omega \in \mathcal{A}}{\operatorname{argmax}} \min_{j=1,\ldots,m} q(x_j, \hat{x}_j(\Omega)). \tag{4}$$

In words, this rule optimizes the quality for the worst-case rather than the average-case.

While it may appear that we require the estimator 19 to be applied to the training signals several times in order to solve these optimization problems, there are cases in which this is not necessary. We proceed by providing an example of a finite-dimensional and noiseless scenario in which it is indeed not necessary, even though the invention is also applicable to infinite-dimensional and noisy scenarios. We consider the measurement model $$b = P_\Omega \Psi x \tag{5}$$

for some orthonormal basis matrix $\Psi \in \mathbb{C}^{p \times p}$, and some subsampling matrix $P_\Omega$ whose rows are canonical basis vectors. We assume without loss of generality that $\|x_j\|=1$ for all j, since the signals can always be normalized to satisfy this condition.

While the focus in the present invention is on the selection of the index set $\Omega$, the recovery algorithm used by the signal estimator 19 also contributes towards achieving the goal. In this example, we consider a procedure that expands b to a p-dimensional vector by placing zeros in the entries corresponding to $\Omega^c$, and then applies the adjoint $\Psi^* = \Psi^{-1}$:

$$\hat{x} = \Psi^* P_\Omega^T b. \tag{6}$$

It is to be noted that this is a linear decoder, and can be implemented highly efficiently even in large-scale systems for suitably structured matrices (e.g. Fourier or Hadamard). Another noteworthy feature of this estimator is that under the quality measure $$q(x, \hat{x}) = -\|x - \hat{x}\|_2^2 \tag{7}$$

that favors estimates that are close to the corresponding signal in the 2-norm, the quality function is an increasing function of the energy captured in the index set, $\|P_\Omega \Psi x_1\|_2^2$. Thus, maximizing the quality measure amounts to maximizing the captured energy.

Alternatively, if x is known to be approximately sparse in some known basis, i.e. $x = \Phi^* z$ for some approximately sparse vector z and basis matrix $\Phi$, then stable and robust recovery is possible using standard CS algorithms. A particularly popular choice is basis pursuit (BP), which estimates $$\hat{z} = \underset{\tilde{z}: b = P_\Omega \Psi \Phi^* \tilde{z}}{\arg\min} \|\tilde{z}\|_1 \tag{8}$$

and then sets $\hat{x}=\Phi^*\hat{z}$. It is also possible to replace the basis pursuit recovery with other convex programs that leverage additional "structured" sparsity of the coefficients.

For the linear decoder, our subsampling strategy is as follows: given the training signals $x_1, \ldots, x_m$, we seek a subsampling scheme that optimizes a function subject to some constraints:

$$\hat{\Omega} = \underset{\Omega \in \mathcal{A}}{\arg\max}\, F(\Omega, x_1, \ldots, x_m), \tag{9}$$

where $\mathcal{A} \subseteq \{\Omega: |\Omega|=n\}$ is a cardinality constrained subset of $\{1, \ldots, p\}$, and the function F is either chosen directly based on the quality measure or a heuristic. In the present example, we consider the choice $$F(\Omega, x_1, \ldots, x_m) := f(\|P_\Omega \Psi x_1\|_2^2, \ldots, \|P_\Omega \Psi x_m\|_2^2) \tag{10}$$

for some function f. Specifically, we find that both (3) and (4) can be written in this form, due to the above-mentioned correspondence between maximum quality measure and maximum energy captured.

Optimization problems of the form (9) are combinatorial, and in general finding the exact solution is non-deterministic polynomial-time (NP) hard, meaning that finding the optimal solution is not computationally feasible. The key idea in all of the examples below is to identify advantageous combinatorial structures in the optimization problem in order to efficiently obtain near-optimal solutions. For instance, it will be shown that submodularity properties in the optimization problems, and more specifically in the function $F(\cdot)$ are helpful.

Definition 1. A set function $h(\Omega)$ mapping subsets $\Omega \subseteq \{1, \ldots, p\}$ to real numbers is said to be submodular if, for $\Omega_1, \Omega_2 \subset \{1, \ldots, p\}$ with $\Omega_1 \subseteq \Omega_2$, and all $i \in \{1, \ldots, p\} \setminus \Omega_2$, we have $$h(\Omega_1 \cup \{i\}) - h(\Omega_1) \geq h(\Omega_2 \cup \{i\}) - h(\Omega_2). \tag{11}$$

The function is said to be modular if the same holds true with equality in place of the inequality.

This definition formalizes the notion of diminishing returns: adding an element to a smaller set increases the objective function more compared to when it is added to a larger set. The focus in this example will be on submodular functions that are also monotonic, i.e., $h(\Omega_2) \geq h(\Omega_1)$ whenever $\Omega_1 \subseteq \Omega_2$. Submodular or modular set functions often allow us to efficiently obtain near-optimal solutions.

In general, the ability to find approximate or exact solutions to (9) also depends on the choice of the constraint set $\mathcal{A} \subseteq \{\Omega: |\Omega|=n\}$. In the context of structured signal recovery, a notable choice is multi-level subsampling, where the indices $\{1, \ldots, p\}$ are split into K disjoint groups, also referred to as levels, with sizes $\{p_k\}_{k=1}^K$, and the number of measurements within the k-th group is constrained to be $n_k$, with $\Sigma_{k=1}^K n_k = n$. Thus, the total number of possible sparsity patterns is $$\prod_{k=1}^K \binom{p_k}{n_k}.$$

This structure can be efficiently handled within our framework. When the combinatorial problem is not tractable, then cutting plane and branch and bound techniques may be applied to obtain satisfactory solutions. In other instances, we can attempt brute force solutions.

In the context of image compression with image-independent subsampling, $\mathcal{A}$ may correspond to the wavelet basis, and a suitable choice for $\mathcal{A}$ forces the coefficients to form a rooted connected subtree of the wavelet tree of cardinality n. In this case, the total number of subsampling patterns is the Catalan number $$\frac{1}{n+1}\binom{2n}{n}.$$

This structure can be handled using dynamic programming, as shown by Bhan et al. "Tractability of Interpretability via Selection of Group-Sparse Models," 2013 IEEE International Symposium on Information Theory.

Average-case criterion ($f=f_{avg}$)

We first consider the function $$f_{avg}(\alpha_1, \ldots, \alpha_m) := \frac{1}{m}\sum_{j=1}^m \alpha_j,$$

yielding the optimization problem $$\hat{\Omega} = \underset{\Omega \in \mathcal{A}}{\arg\max}\, \frac{1}{m}\sum_{j=1}^m \sum_{i \in \Omega} |\langle \psi_i, x_j \rangle|^2, \tag{12}$$

where $\psi_i$ is the i-th row $\Psi$. This corresponds to maximizing the average energy in the training signals. In other words, according to this optimization problem, a sum of the energies in the training signals, captured by samples at the sampling locations given by the n indices, is as large as possible. As mentioned above, this in fact corresponds to minimizing the squared-error recovery performance for the linear decoder in (6). That is, equation (12) is simply a re-write of equation (3). It is to be noted that in equation (12), the exponent, instead of being 2, could be q, where $q>0$.

Since the sum of (sub)modular functions is again (sub)modular, it can be seen that (12) is a modular maximization problem, thus permitting an exact solution to be found efficiently in several cases of interest.

Case 1 (no additional constraints): In the case where the problem is $$\hat{\Omega} = \underset{\Omega \in \mathcal{A}}{\arg\max}\, \frac{1}{m}\sum_{j=1}^m \sum_{i \in \Omega} |\langle \psi_i, x_j \rangle|^2, \tag{13}$$

where $\mathcal{A} \subseteq \{\Omega: |\Omega|=n\}$, the exact solution is found by sorting: Select the n indices whose values of $$\frac{1}{m}\sum_{j=1}^m |\langle \psi_i, x_j \rangle|^2$$

are the largest. The running time is dominated by the precomputation of the values $$\frac{1}{m}\sum_{j=1}^{m}|\langle\psi_i, x_j\rangle|^2,$$

and behaves as $O(mp^2)$ for general matrices $\Psi$, or $O(mp \log p)$ for suitably structured matrices such as Fourier and Hadamard.

Case 2 (multi-level sampling): In the case that the constraints defining $\mathcal{A}$ correspond to multi-level sampling as defined above, the exact solution is found by simply performing sorting within each level.

Case 3 (rooted connected tree constraint): Choosing the set $\mathcal{A}$ that forces the coefficients to form a rooted connected wavelet tree, there exists a dynamic program for finding the optimal solution in $O(np)$ time.

Generalized Average-case Criterion ($f=f_{gen}$)

We generalize the choice $f=f_{avg}$ by considering $$f_{gen}(\alpha_1, \ldots, \alpha_m) := \frac{1}{m}\sum_{j=1}^{m} g(\alpha_j), \quad (14)$$

yielding $$\hat{\Omega} = \underset{\Omega \in \mathcal{A}}{\arg\max} \frac{1}{m}\sum_{j=1}^{m} g \sum_{i \in \Omega} |\langle\psi_i, x_j\rangle|^2,$$

for some function g: $[0,1] \to R$. We consider the case that g is an increasing concave function with $g(0)=0$. It is to be noted that in equation (14), the exponent, instead of being 2, could be q, where $q>0$.

It is to be noted that this example also permits weights $\beta_{ij}$ in front of the terms $|\langle\psi_i, x_j\rangle|^2$ in all of the optimization problems. This permits certain training signals to be treated as more important than others (via higher values of $\{\beta_{ij}\}_{i=1}^{p}$), and also permits the energy of certain parts of the signal to be considered more important than the energy in others parts (via higher values of $\{\beta_{ij}\}_{i=1}^{m}$. In the present description, we focus only on uniform weights for clarity of explanation.

We established above that the argument to g in (14) is a modular function of $\Omega$. Recalling that g is concave and increasing by assumption, it follows that (14) is a submodular optimization problem. While finding the exact solution is hard in general, it is possible to efficiently find an approximate solution with rigorous guarantees in several cases.

Case 1 (no additional constraints): In the case that $\mathcal{A} \subseteq \{\Omega: |\Omega|=n\}$, a solution whose objective value is within a multiplicative factor of $$1 - \frac{1}{e}$$

of the optimum can be found via a simple greedy algorithm: start with the empty set, and repeatedly add the item that increases the objective value by the largest amount, terminating once n indices have been selected. The values $|\langle\psi_i, x_j\rangle|^2$ can be computed in $O(mp^2)$ (general case), or $O(mp \log p)$ (structured case), and the greedy algorithm itself can be implemented in $O(nmp)$ time, with the factor of m arising due to the summation in (14).

Case 2 (matroid constraints): Although we do not explore them in detail in the present description, there exist algorithms for obtaining solutions that are within a factor of $$1 - \frac{1}{e}$$

of the optimum for more general constraint sets $\mathcal{A}$, known as matroid constraints, see for example Filmus and Ward, "A tight combinatorial algorithm for submodular maximization subject to a matroid constraint", Foundations of Computer Science conference 2012. For example, the above-mentioned multi-level sampling constraint falls into this category.

Worst-case Criterion ($f=f_{min}$)

Finally, we consider the choices $\mathcal{A} \subseteq \{\Omega: |\Omega|=n\}$ and $f_{min}(\alpha_1, \ldots, \alpha_m) := \min_{j=1, \ldots, m} \alpha_j$, yielding $$\hat{\Omega} = \underset{\Omega:|\Omega|=n}{\arg\max} \min_{j=1,\ldots,m} \sum_{i \in \Omega} |\langle\psi_i, x_j\rangle|^2. \quad (15)$$

This can be thought of as seeking robustness with respect to the "worst" image in the training set, which may be desirable in some cases. In other words, this optimization problem is solved so that a minimum of the energies in the training signals, captured by samples at the sampling locations given by the n indices, is as large as possible. Note that in this example, equation (15) is equivalent to equation (4). It is to be noted that in equation (15), the exponent, instead of being 2, could be q, where $q>0$.

The objective function in (15) is the minimum of m modular functions, and there exist algorithms for solving general problems of this form, including an algorithm called Saturate proposed by Krause et al. in "Robust Submodular Observation Selection", Journal of Machine Learning Research, vol. 9, 2761-2801, 1-2008. The running time is $O(p^2 m \log m)$ in the worst case. In practice, it has been observed to run the algorithm much faster. Moreover, it was found that the total number of samples returned by the algorithm is very close to its maximum value an (e.g. within 1%).

It is also possible to consider a generalization of all the previous optimization problem approaches, where instead of defining the energy in terms of the $l_2$ norm, we generalize it to any $l_q$ norm, for $q \geq 1$. That is, we can replace $|\langle\psi_i, x_j\rangle|^2$ with $|\langle\psi_i, x_j\rangle|^q$.

While the above approaches are finite-dimensional, the teachings of the present invention can directly be applied to infinite-dimensional settings. In such cases, we have $\Omega \subset \{1, 2, \ldots\}$, so it is practically not possible to search over all possible indices. Nevertheless, truncation methods are directly applicable to the training signals (see Adcock and Hansen, "Generalized sampling and infinite-dimensional compressed sensing", University of Cambridge technical report, 2011), and a suitable truncation length can be learned from the training signals.

Figure 5:
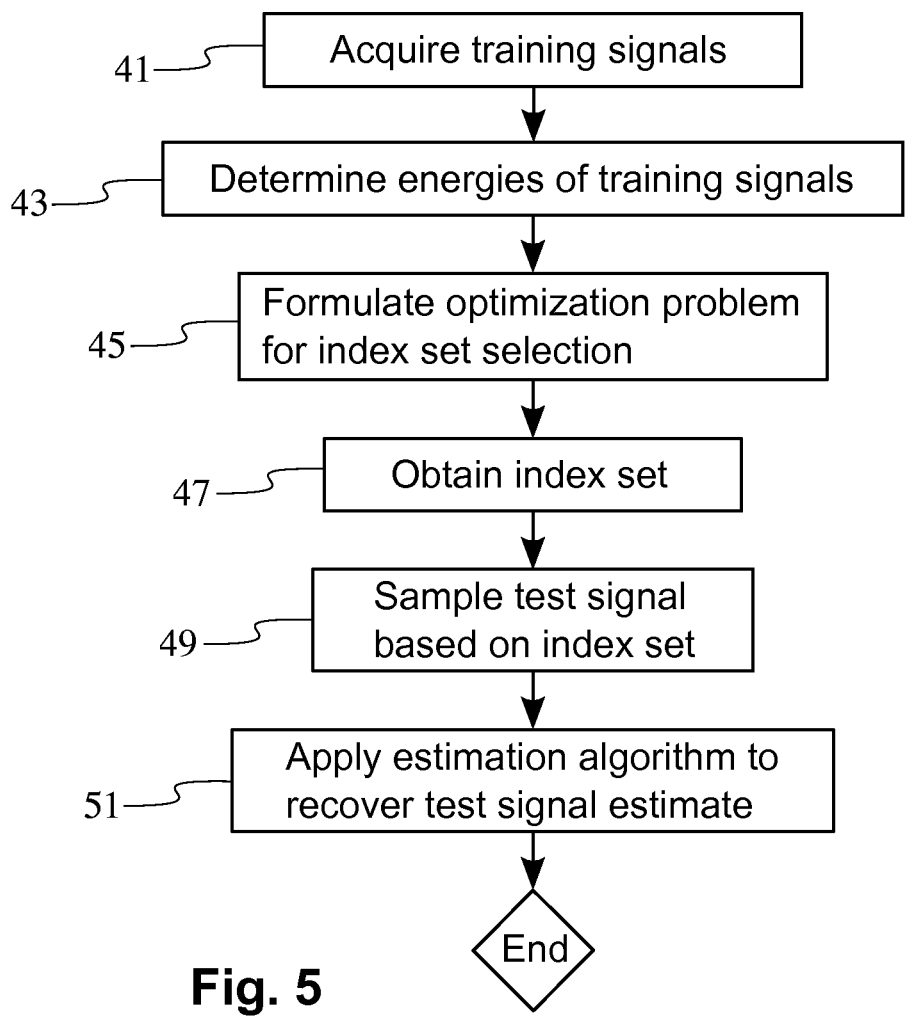
FIG. 5 is a flow chart illustrating another exemplary signal processing method according to the present invention.

The above signal sampling method is summarized by the flow chart of FIG. 5. In step 41 the training signals are acquired and possibly stored in the storage 11. The training signals are then sampled if they have not been sampled yet. In step 43 energies of the training signals are calculated. In step 45 the optimization problem is generated in order to determine the index set $\Omega$. In the above example, the optimization problem is formulated based on the three criteria explained above: average case criterion, generalized average case criterion or worst case criterion. Accordingly, the optimization problem may be one of the equations (12), (14) or (15). In step 47 the index set Ω is obtained as a solution to the optimization problem. In this example the index set Ω is a fixed set. This means that the index set Ω remains unchanged for various test signals that are sampled based on the given training signals. In step 49, the test signal is sampled based on the index set Ω. This means that the test signal is sampled at the locations defined by the indices of the index set Ω. In this example, the test signal is sampled only at the locations defined by the indices of the index set Ω. The locations outside the index set Ω are not sampled. Then, in step 51, starting from the samples obtained in step 49, an estimate of the test signal is generated. It is to be noted that the order of the steps above may be changed when appropriate.

The proposed invention has a wide range of sensing applications as explained next in more detail.

Wearable and Implantable Bio-sensors

Nowadays, there is a growing interest in designing and building sensors for real-time monitoring of health-related biological signals. These sensors are either worn around the body, e.g., heart-rate monitors, or directly implanted in the body. One such field of application is the recording of neuro-electrical signals from the brain, which may allow for the early detection of epileptic seizures or an understanding of the neurological basis of depression. For these cases, the sensor must be small enough to avoid damaging the cerebral tissue and also consume as little power as possible to avoid overheating the brain. To overcome these issues, area and power-efficient compressive sensing-based circuits have been proposed for reducing the data size before transmission, which is main power drain. Furthermore, it has often been reported that biological signals are structured and not completely random. Therefore, the proposed invention can directly exploit the structure in the signals in order to provide a fixed sampling pattern that allows for greater compression rates than randomized approaches, while maintaining high signal reconstruction performance.

Magnetic Resonance Imaging

In MRI, Fourier samples of an object are measured in order to create a 3D image of its interior. Many modern systems already exploit compressive sensing and the structure in the object for reducing the number of samples necessary for reconstruction. However, none of the methods proposed in the literature so far are capable of adapting to a specific class of objects. For instance, in many research applications of MRI, the scientists are interested in acquiring images of the same objects over and over again, subject to small changes. The method according to the present invention can adapt to the specific structure of these objects and provide a more compact sampling pattern that allows a reduction of the scan time, while providing the same or better reconstruction quality.

Computed Tomography

In X-ray computed tomography (CT), parallel beams of X-rays shine through an object of interest and are partially absorbed along the way. Multiple projected images are recorded by varying the angle of incidence of the beam. From these projections, it is possible to reconstruct the internal 3D structure of the object. However, current methods require many projections to be recorded at small angular increments in order to obtain high quality reconstructions. As is the case for MRI, CT scans are often made of similar objects, and the present invention can therefore leverage the similarities and the structures of these objects in order to select only those angles that yield the most informative projections, without sacrificing the quality of the reconstructions.

CMOS-based Imaging

Recently, a complementary metal-oxide-semiconductor (CMOS) image sensor that is capable of directly capturing transformations of images has been proposed, allowing one to compressively sense images, instead of first acquiring the signals for all the pixels and then compressing. The main limitation of this sensor consists in the need to define a suitable set of coefficients to sample to achieve an optimal trade-off between the compression rate and the image reconstruction quality. The present invention can be directly applied to this problem by optimizing the sampling strategy from previous images.

Ultrasound

Real-time 3D ultrasound imaging (UI) has the potential to overcome many of the limitations of standard 2D ultrasound imaging, such as limited probe manipulation for certain tissues, while providing real-time volumetric images of organs in motion. However, 3D UI requires the measurement and processing of a tremendous amount of data in order to achieve good image quality. Recently, leveraging ideas from 2D frequency beamforming, a technique to reduce the sampled data has been proposed. A key element of this technique is to define a small range of discrete Fourier coefficients to be retained per 2D slice. The present invention can be directly applied to this domain in order to optimize the subset of discrete Fourier coefficients to sample for each class of images.

As explained above, the present invention provides a principled learning-based approach to subsampling the rows of an orthonormal basis matrix for structured signal recovery, thus providing an attractive alternative to traditional approaches based on parameterized random sampling distributions. Combinatorial optimization problems were proposed based on the average-case and worst-case energy captured in the training signals, obtained solutions via the identification of modularity and submodularity structures.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used.

The invention claimed is:

1. A method of sampling a test signal in magnetic resonance imaging system, the method comprising:
   acquiring training signals sampled at a plurality of sampling locations of a plurality of test subjects using a sampler configured to sample the training signals;
   running an optimization procedure for determining an index set of n indices, representing a subset of the sampling locations, that maximize a function, over at least some of the training signals, of a quality parameter representing how well a given training signal is represented by the n indices; and sampling the test signal of a single test subject during a magnetic resonance imaging test at only the sampling locations represented by the n indices using the sampler, wherein the optimization procedure maximizes an average of the quality parameters of the training signals by solving an optimization problem of the type:

$$\hat{\Omega} = \underset{\Omega \in \mathcal{A}}{\operatorname{argmax}} \sum_{j=1}^{m} q(x_j, \hat{x}_j(\Omega)),$$

where m is the number of training signals x, $\hat{x}$ is a training signal estimate, $q(x_j, \hat{x}_j(\Omega))$, is the quality parameter, $\mathcal{A} \subseteq \{\Omega: |\Omega|=n\}$ is a cardinality-constrained subset of $\{1, \ldots, p\}$ in which the selected index set is assumed to lie, and p is a dimension of the test signal, or the optimization procedure maximizes a minimum of the quality parameters of the training signals by solving an optimization problem of the type:

$$\hat{\Omega} = \underset{\Omega \in \mathcal{A}}{\operatorname{argmax}} \min_{j=1,\ldots,m} q(x_j, \hat{x}_j(\Omega)).$$

2. The method according to claim 1, wherein the optimization procedure forms training signal estimates for at least some of the training signals, based only on samples obtained at sampling locations represented by a candidate index set to obtain the index set.

3. The method according to claim 1, wherein the quality parameter corresponds to a given training signal energy.

4. The method according to claim 1, wherein the quality parameter is derived from a mean-square error of the training signal estimates.

5. The method according to claim 1, further comprising applying one or more weighing factors in the optimization procedure to prioritize some training signals and/or some parts of the training signals.

6. The method according to claim 1, wherein sampling of the test signal is done non-uniformly.

7. The method according to claim 1, wherein substantially no sampling of the test signal is done outside the locations given by the n indices.

8. The method according to claim 1, wherein the data sample set comprises data samples from fully sampled training signals.

9. The method according to claim 1, wherein samples of the one or more training signals have the most energy substantially at the same locations as samples of the test signal.

10. The method according to claim 1, wherein the index set is used for sampling further test signals.

11. The method according to claim 1, wherein in the determination of the index set n, one or more constraints relating to at least one of the following are taken into account: sampling apparatus, settings of the sampling apparatus, test signal type and user.

12. A signal sampling apparatus of magnetic resonance imaging system for sampling a test signal, the apparatus comprising means for:

acquiring training signals sampled at a plurality of sampling locations of a plurality of test subjects using a sampler configured to sample the training signals;

running an optimization procedure for determining an index set of n indices, representing a subset of the sampling locations, that maximize a function, over at least some of the training signals, of a quality parameter representing how well a given training signal is represented by the n indices; and sampling the test signal of a single test subject during a magnetic resonance imaging test at only the sampling locations represented by the n indices using the sampler, wherein the optimization procedure maximizes an average of the quality parameters of the training signals by solving an optimization problem of the type:

$$\hat{\Omega} = \underset{\Omega \in \mathcal{A}}{\operatorname{argmax}} \sum_{j=1}^{m} q(x_j, \hat{x}_j(\Omega)),$$

where m is the number of training signals x, $\hat{x}$ is a training signal estimate, $q(x_j, \hat{x}_j(\Omega))$ is the quality parameter, $\mathcal{A} \subseteq \{\Omega: |\Omega|=n\}$ is a cardinality-constrained subset of $\{1, \ldots, p\}$ in which the selected index set is assumed to lie, and p is a dimension of the test signal, or the optimization procedure maximizes a minimum of the quality parameters of the training signals by solving an optimization problem of the type:

$$\hat{\Omega} = \underset{\Omega \in \mathcal{A}}{\operatorname{argmax}} \min_{j=1,\ldots,m} q(x_j, \hat{x}_j(\Omega)).$$

13. The signal sampling apparatus according to claim 12, wherein the signal sampling apparatus is a linear signal sampling apparatus.

* * * * *